(12) United States Patent
Usami et al.

(10) Patent No.: US 7,135,399 B2
(45) Date of Patent: Nov. 14, 2006

(54) DEPOSITION METHOD FOR WIRING THIN FILM

(75) Inventors: Tetsuo Usami, Tokyo (JP); Yoshikazu Arakawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/754,264

(22) Filed: Jan. 5, 2001

(65) Prior Publication Data
US 2001/0034128 A1    Oct. 25, 2001

(30) Foreign Application Priority Data
Apr. 19, 2000   (JP) ............... 2000-117990

(51) Int. Cl.
*H01L 21/4763* (2006.01)
*H01L 21/44* (2006.01)

(52) U.S. Cl. ............ 438/622; 438/629; 438/643; 438/660; 438/663; 438/688

(58) Field of Classification Search ........... 438/688, 438/663, 660, 622, 629, 643
See application file for complete search history.

(56) References Cited

U.S. PATENT DOCUMENTS 5,180,687 A * 1/1993 Mikoshiba et al. ......... 437/187
5,604,155 A * 2/1997 Wang .......................... 437/190
5,646,449 A * 7/1997 Nakamura et al. .......... 257/761
6,051,490 A * 4/2000 Taguchi et al. .............. 438/618
6,268,290 B1 * 7/2001 Taguchi et al. .............. 438/688

FOREIGN PATENT DOCUMENTS

| JP | 7-7077 | 1/1995 |
| JP | 7-335759 | 12/1995 |
| JP | 9-249966 | * 9/1997 |

* cited by examiner

*Primary Examiner*—Long Pham
*Assistant Examiner*—Shrinivas H. Rao
(74) *Attorney, Agent, or Firm*—VolentineFrancos&Whitt,PLLC

(57) ABSTRACT

An $Al_3Ti$ film having a large amount of dissolved Si is deposited on a semiconductor substrate to form a laminate with an Al wiring film, and heat treatment is performed at a temperature of at least 400° C., to thereby absorb excessive Si into the $Al_3Ti$ film and so prevent the occurrence of Si nodules. By depositing Al film at a temperature of at least 400° C. at the time of depositing the Al wiring film on the $Al_3Ti$ film, excessive Si is caused to be absorbed in the $Al_3Ti$ film. Further, at the time of depositing a Ti film on the semiconductor substrate and depositing the Al wiring film, the Al film is deposited at a temperature of a least 400° C., there is reaction between the Ti film within the laminate, causing an $Al_3Ti$ film to be produced, and excessive Si is absorbed in the $Al_3$ Ti film produced.

12 Claims, 9 Drawing Sheets

DEPOSITION METHOD FOR WIRING THIN FILM

BACKGROUND OF THE INVENTION

1. Field of the Invention

The present invention relates to a semiconductor element manufacturing method and to the construction of an element manufactured using the method, and particularly to a deposition method for a thin film used as wiring and a laminated construction for a thin film deposited using this method.

2. Description of the Related Art

In the case of forming an element on a conventional semiconductor substrate, a wiring thin film deposition method as shown in FIGS. 1–3 is carried out. First of all, an insulating film 2 (for example, $SiO_2$ BPSG) is deposited on a semiconductor substrate 1 typically of a material such as silicon, and a barrier layer 3 (for example, Ti, TiN or a laminate of the two) is deposited. Next, an Al film is deposited with the semiconductor substrate heated to 150–400° C., by a sputtering method using an Al—Si—Cu target having Si added to 0.05–1.0% which is at least the solution limit of Al.

Here, Si is added to improve EM (electromigration) resistance. Also, the reason for heating the semiconductor substrate at the time of Al deposition is to increase the size of the Al grains (crystal grain) to increase EM resistance, and to improve step coverage. Next, an antireflection membrane (ARM) 5 that is, for example, Ti, TiN or a laminate of the two, is deposited, preferably by performing a photolithography process. After that, wiring is patterned using a well known photolithography method or etching method.

However, with the Al thin film sputter deposited using an Al—Si—Cu target having Si added to at least the solution limit of Al as described above, there are the following problems. Specifically, at the time of depositing the Al film, deposited Si particles 6 are dissolved in the Al due to the high heating temperature of the deposition, and in a process of cooling the wafer gradually after deposition from the deposition temperature there is a nucleus of remaining Si that could not be dissolved. Recrystallization growth of the temporarily dissolved Si starts, as a result of which an enormous Si deposit 7 is formed (refer to FIG. 4(1)-(3). This Si deposit 7 deposited in the Al film is not removed by etching gas in the $Cl_2$ family that is normally used at the time of etching the Al film in a subsequent step, and as a result remains as an Si residue. As shown in FIG. 5, this Si residue 8 unfortunately acts as a mask at the time of etching the Al underneath the residue. Because of this, pattern defects arise, and if the size of the Si residue becomes larger than an interval between wires in the wiring pattern this will cause shorting between wires.

SUMMARY OF THE INVENTION

An object of the present invention is to solve the problem of Si nodules that occurs when depositing an Al wiring film with a sputter method using an Al—Si—Cu target, and to provide a more stable deposition method for a wiring thin film that prevents Si nodules occurring.

With the present invention, in order to achieve the above object, there is a wiring thin film deposition method comprising the steps of depositing a Ti film on a semiconductor substrate, and depositing an Al—Si—Cu film on the Ti film at a temperature of at least 400° C. According to this method, it is possible to achieve the above described object because an $Al_3$ film is formed between layers of the Ti film and the Al—Si—Cu film and excess Si is absorbed.

There is also provided a wiring thin film deposition method including the steps of depositing a Ti film on a semiconductor substrate, depositing an Al—Si—Cu film on the Ti film, and annealing the semiconductor substrate at a temperature of at least 400° C. The basic concept of this method is absorption of Si by an $Al_3Ti$ film.

There is also provided a wiring thin film deposition method comprising the steps of depositing a Ti film on a semiconductor substrate, depositing an $Al_3Ti$ film on the Ti film, and depositing an Al—Si—Cu film on the $Al_3Ti$ film at a temperature of at least 400° C., and the basic concept of this method is as described above.

There is also provided a wiring thin film deposition method comprising the steps of depositing a Ti film on a semiconductor substrate, depositing an $Al_3Ti$ film on the Ti film, depositing an Al—Si—Cu film on the $Al_3Ti$ film, and annealing the semiconductor substrate at a temperature of at least 400° C., and the basic concept of this method is as described above.

Still further, there is provided a wiring thin film deposition method comprising the steps of depositing a Ti film on a semiconductor substrate, depositing an Al—Si—Cu film on the Ti film, depositing an $Al_3Ti$ film on the Al—Si—Cu film, and annealing the semiconductor substrate at a temperature of at least 400° C., and the basic concept of this method is also as described above.

DETAILED DESCRIPTION OF THE PREFERRED EMBODIMENTS (First Embodiment)

Figure 1:
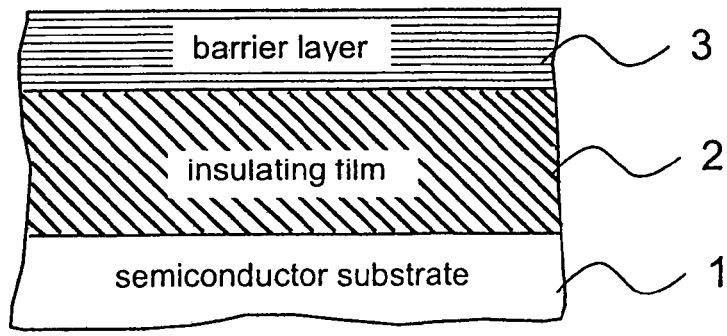
FIG. 1 is a first cross sectional drawing showing a process of the related art.
Figure 2:
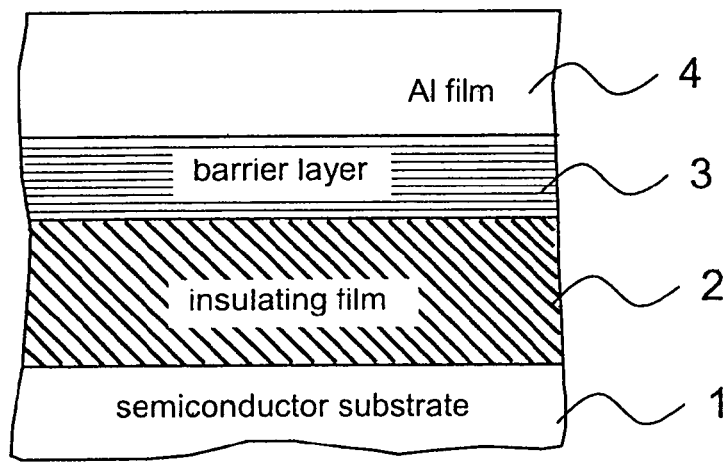
FIG. 2 is a second cross sectional drawing showing a process of the related art.
Figure 3:
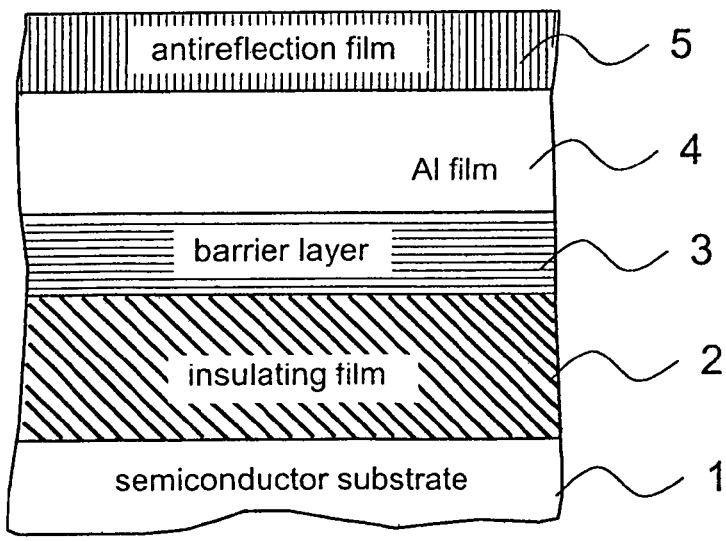
FIG. 3 is a third cross sectional drawing showing a process of the related art.
Figure 4:
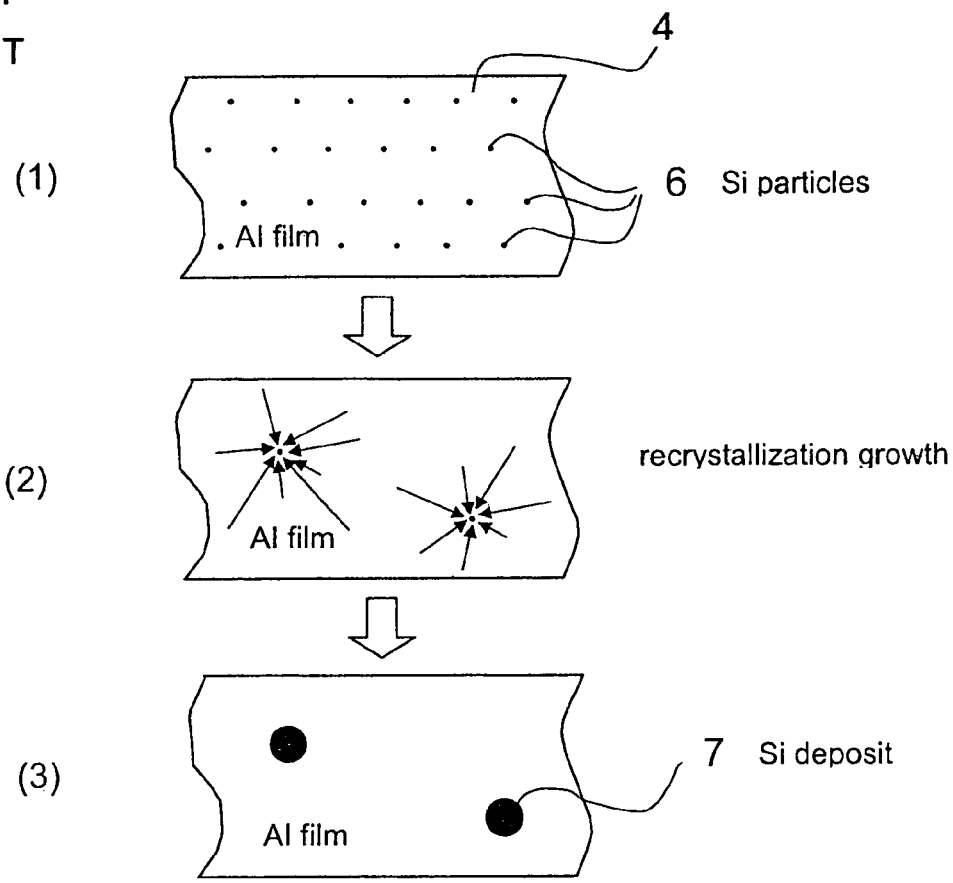
FIG. 4 shows the mechanism of the related art process.
Figure 5:
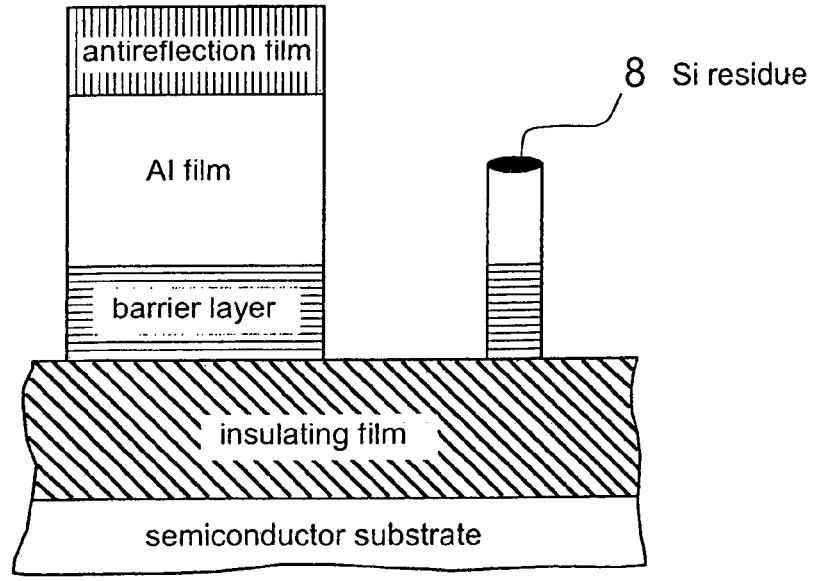
FIG. 5 shows the disadvantages of the related art.
Figure 6:
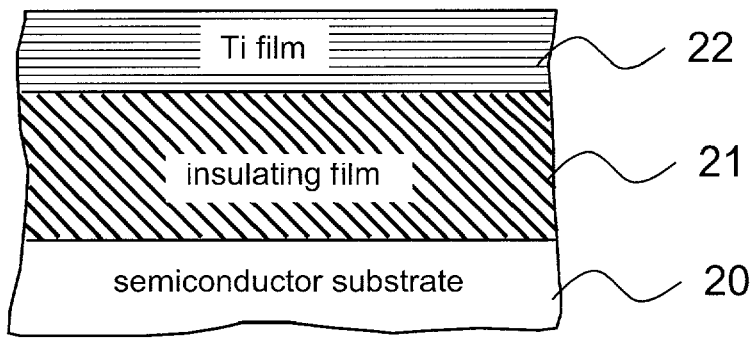
FIG. 6 is a first cross sectional drawing showing a process of a first embodiment of the present invention.
Figure 7:
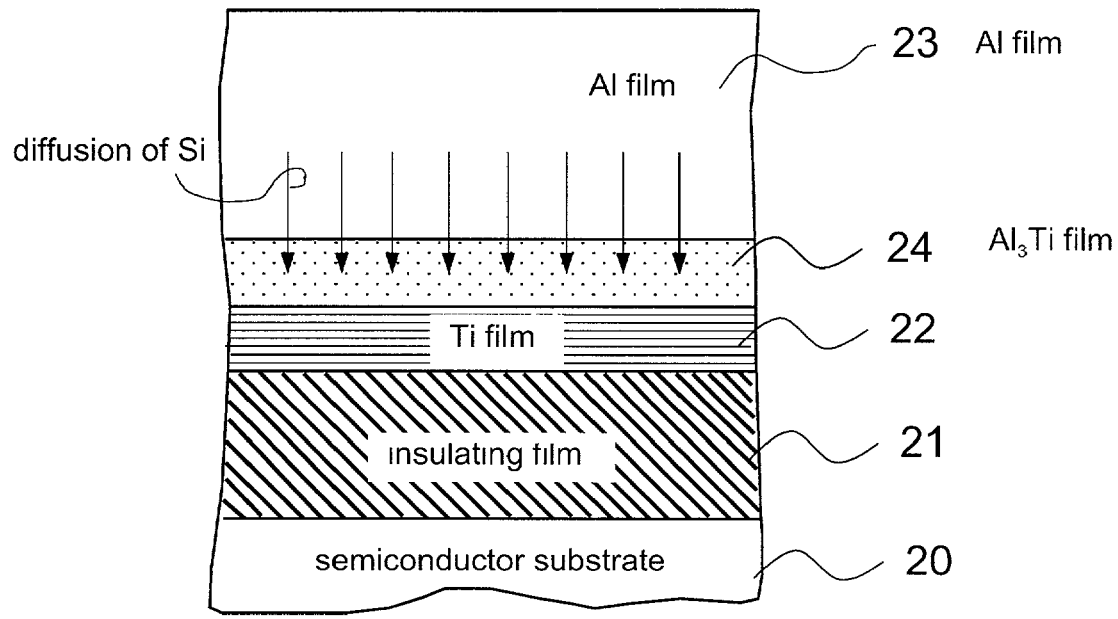
FIG. 7 is a second cross sectional drawing showing a process of the first embodiment of the present invention.
Figure 8:
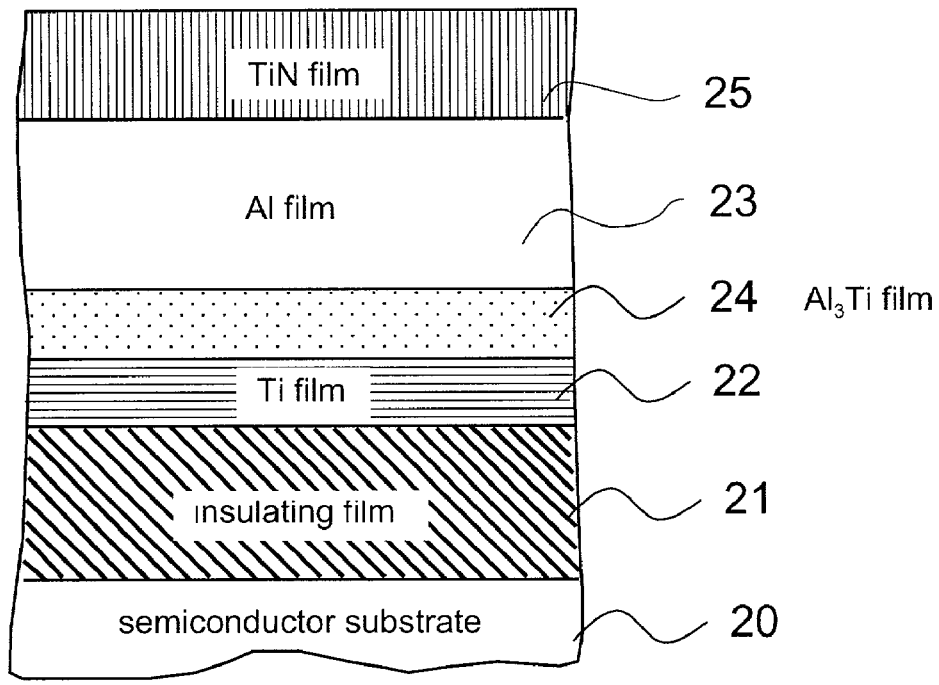
FIG. 8 is a third cross sectional drawing showing a process of the first embodiment of the present invention.

A first embodiment of the present invention will now be described in detail using to FIG. 6 to FIG. 8. First of all, an insulating film 21 (for example SiO$_2$, BPSG) is deposited on a semiconductor substrate 20. Next, a Ti film 22, for example, is deposited to a thickness of 50 nm, as a barrier layer. An Al film 24 is then deposited to a thickness of 400–800 nm by a sputter method using an Al-1.0% Si-0.5% Cu target. The temperature when this Al film is deposited is a least 400° C.

In this way, if the Al film is deposited under high temperature conditions, reaction between the Al and Ti is promoted to form am Al$_3$Ti alloy layer 24. It is confirmed that the Al$_3$Ti contacting this Al surface absorbs Si within the Al. For example, the extent of Si dissolved in the Al$_3$Ti at 450° C. is about 15 weight %, which is extremely high.

Accordingly, with this embodiment, diffusion of Si into the Al$_3$Ti is promoted and the amount of Si in the Al is reduced, so that there is no Si deposit due to recrystallization. Since this Al$_3$Ti alloy layer 24 is formed, the temperature of the semiconductor substrate at the time of deposition of the Al film is at least 400° C., and the Al film is deposited. After that, a TiN film, for example, is deposited to a thickness of 50 nm, as an antireflection film, and then patterning is performed using a well known method.

As described above, according to the present invention, in the case where the barrier layer is Ti, by depositing an Al film with a high wafer temperature of at least 400° C., reaction between Al and Ti is promoted, and an Al$_3$Ti alloy layer is formed. The Al$_3$Ti contacting the Al surface absorbs Si in the Al film due to the high temperature processing at the time of depositing the Al film. Accordingly, the amount of Si on the Al film is reduced, and it is possible to suppress re-crystallization of Si during a process of cooling the wafer gradually from the film formation temperature. In this way, it is possible to prevent the formation of an enormous Si deposit, and by preventing pattern defects at the time of Al etching that would normally be caused by such an Si deposit it is possible to prevent short circuits between wires.

(Second Embodiment)

Figure 9:
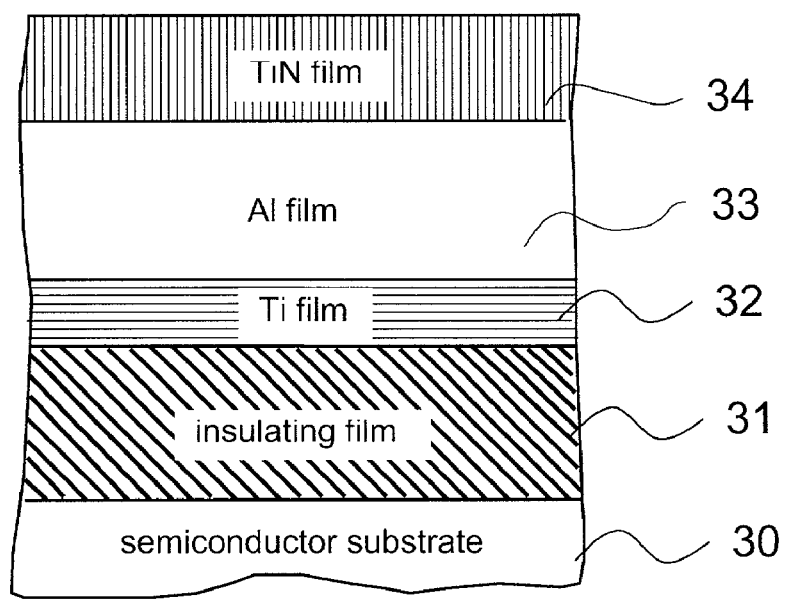
FIG. 9 is a first cross sectional drawing showing a process of a second embodiment of the present invention.
Figure 10:
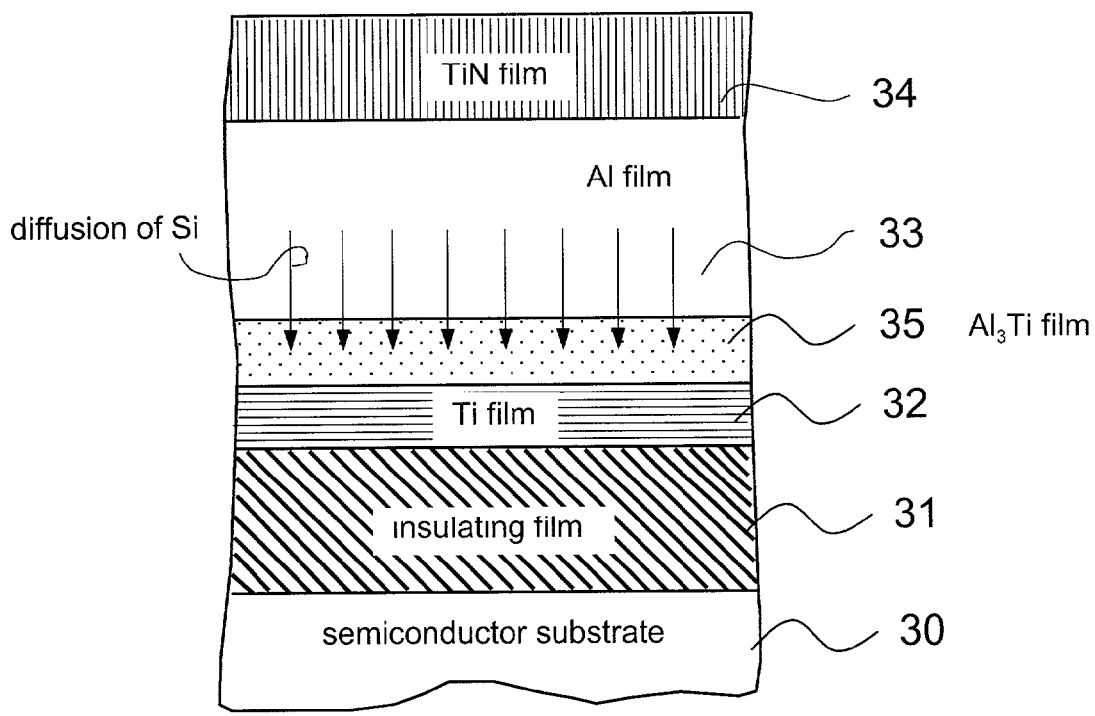
FIG. 10 is a second cross sectional drawing showing a process of the second embodiment of the present invention.

A second embodiment of the present invention will now be described using FIG. 9 and FIG. 10. First of all, an insulating film 31 (for example SiO$_2$, BPSG) is deposited on a semiconductor substrate 30. Next, a Ti single layer film 32, for example, is deposited to a thickness of 50 nm, as a barrier layer. An Al film 33 is then deposited to a thickness of 400–800 nm by a sputter method using an Al-1.0% Si-0.5% Cu target. Then, a TiN film is deposited to a thickness of 50 nm, as a barrier layer. The deposition conditions for each of the films can be the same as in the related art.

Once deposition of the above films is completed, the semiconductor substrate is annealed at a high temperature of at least 400° C. As a result of this annealing process reaction between the Al and Ti is promoted, and an Al$_3$Ti alloy layer is formed. It was confirmed that Al$_3$Ti coming to contact with this Al surface absorbed Si within the Al, as described above. Accordingly, with this embodiment diffusion of Si into the Al$_3$Ti is promoted and the amount of Si in the Al is reduced, making it possible to prevent any Si deposit due to recrystallization.

As described above, according to the second embodiment, after deposition of an anti-reflection film has been completed in the case of a Ti barrier layer, reaction between Al and Ti is promoted, by performing annealing processing at at least 400° C., and an Al$_3$Ti alloy layer is formed. Since the temperature of the Al$_3$Ti alloy layer 35 coming to contact with this Al surface is high at the time of annealing, Si in the Al is absorbed. As a result, the amount of Si in the Al is reduced, and it is possible to suppress recrystallization growth of Si in a step of cooling the semiconductor substrate from the film deposition temperature. In doing this, it is possible to prevent formation of an enormous Si deposit, and by preventing pattern defects at the time of Al etching caused by the Si deposit it is possible to prevent shorts between wires.

(Third Embodiment)

Figure 11:
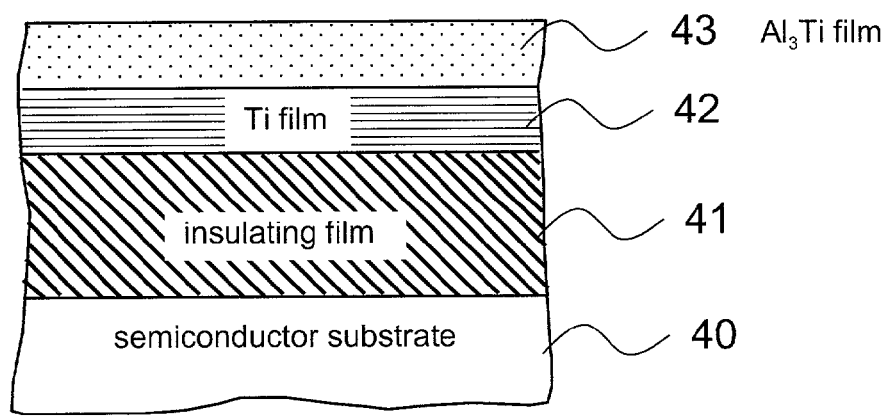
FIG. 11 is a first cross sectional drawing showing a process of a third embodiment of the present invention.
Figure 12:
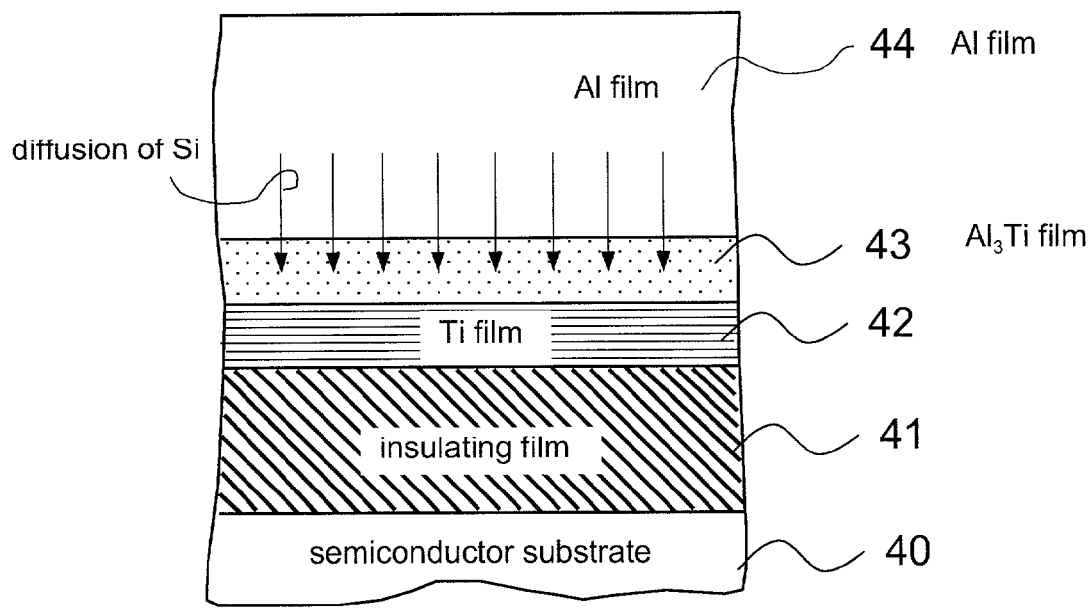
FIG. 12 is a second cross sectional drawing showing a process of the third embodiment of the present invention.
Figure 13:
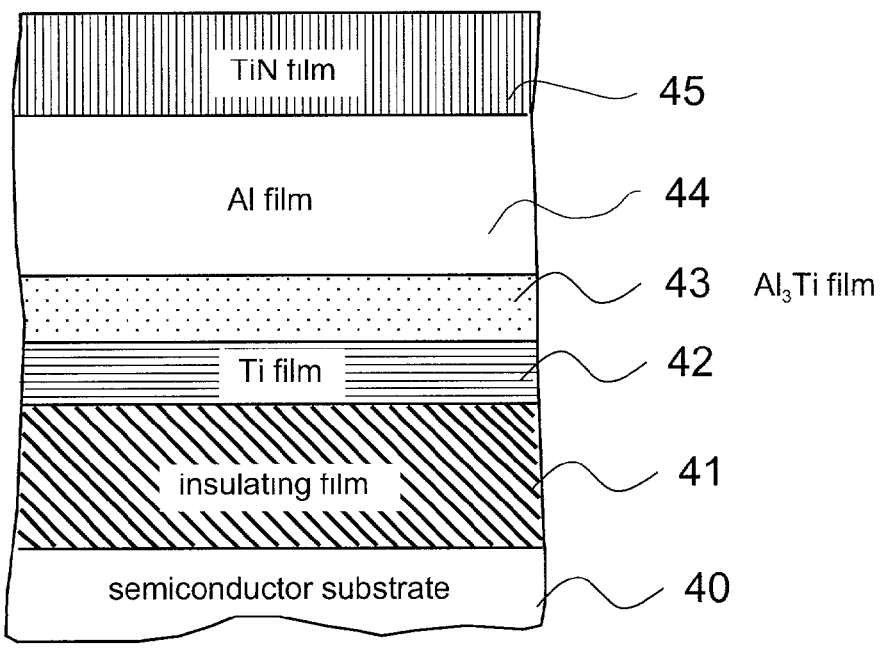
FIG. 13 is a third cross sectional drawing showing a process of the third embodiment of the present invention.

A third embodiment of the present invention will now be described using FIG. 11, FIG. 12 and FIG. 13. First of all, an insulating film 41 (for example SiO$_2$, BPSG) is deposited on a semiconductor substrate 40. Next, a Ti film 42 is deposited to a thickness of 50 nm, as a barrier layer. The film formation conditions up to the barrier layer can be the same as in the related art. With this embodiment, before deposition of Al, an Al$_3$Ti film 43 is previously deposited to a thickness of 10–20 nm by a sputter method using an Al$_3$Ti target. An Al film 44 is then deposited to a thickness of 400–800 nm at a deposition temperature of at least 400° C. by a sputter method using an Al-1.0% Si-0.5% Cu target. The reason for making the deposition temperature of the Al film at least 400° C. is to promote absorption of Si into the Al$_3$Ti. After that, a TiN film is deposited to a thickness of 50 nm as an anti-reflection film.

As described above, according to the third embodiment, by previously depositing the Al$_3$Ti film before Al deposition using an Al$_3$Ti target, and then depositing the Al film at a high temperature of at least 400° C., the Al$_3$Ti film coming into contact with the Al absorbs Si in the Al at the time of film formation, which reduces the amount of Si in the Al, and it is possible to suppress Si recrystallization growth in a step of cooling the wafer from the film formation temperature. In this way, it is possible to prevent formation of an enormous Si deposit, and by preventing pattern defects that would be caused by the Si deposit at the time of Al etching it is possible to prevent shorts between wires.

(Fourth Embodiment)

Figure 14:
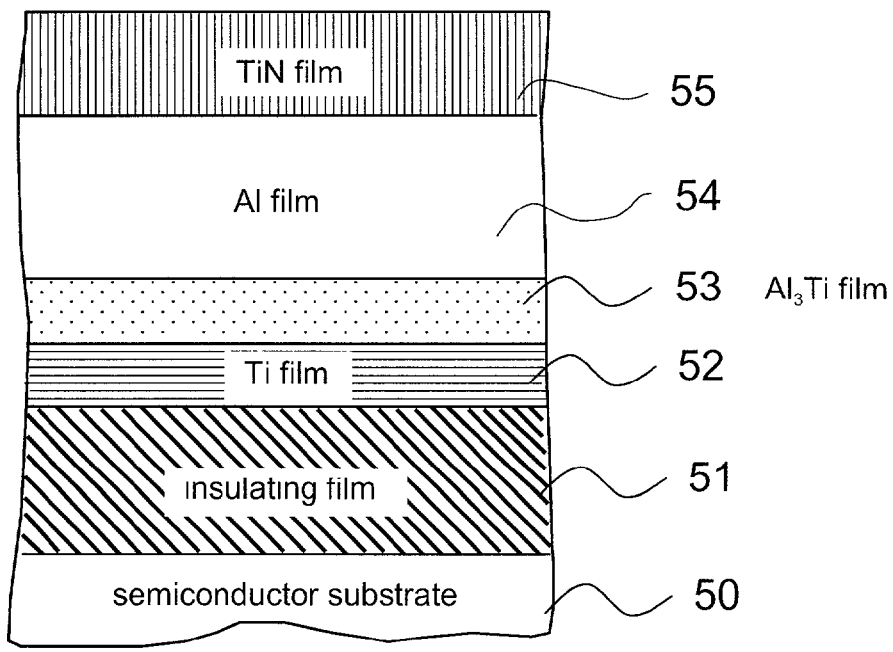
FIG. 14 is a first cross sectional drawing showing a process of a fourth embodiment of the present invention.
Figure 15:
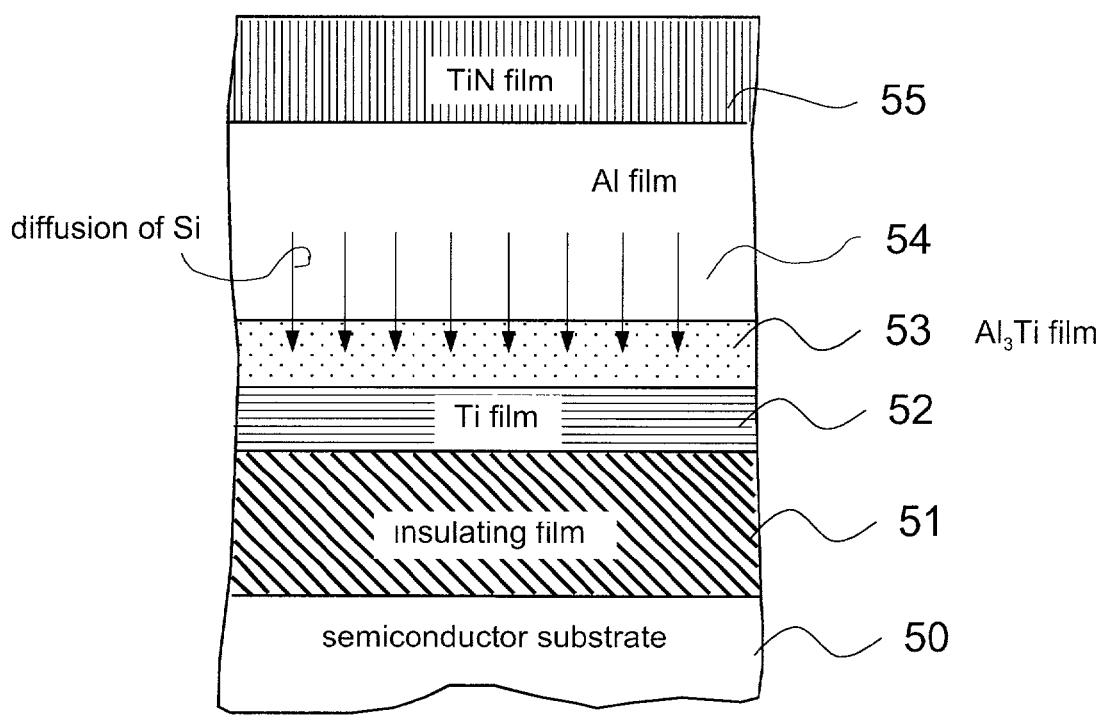
FIG. 15 is a second cross sectional drawing showing a process of the fourth embodiment of the present invention.

A fourth embodiment of the present invention will now be described using FIG. 14 and FIG. 15. First of all, an insulating film 51 (for example SiO$_2$, BPSG) is deposited on a semiconductor substrate 50. Next, a Ti film 52 is deposited to a thickness of 50 nm, as a barrier layer. The film formation conditions up to the barrier layer can be the same as in the related art. With this embodiment, before deposition of Al, an Al$_3$Ti film 53 is previously deposited to a thickness of 10–20 nm by a sputter method using an Al$_3$Ti target. An Al film 54 is then deposited to a thickness of 400–800 nm by a sputter method using an Al-1.0% Si- 0.5% Cu target. After that, a TiN film 55 is deposited to a thickness of 50 nm as an anti-reflection film. After deposition of the above films has been completed, the semiconductor substrate is annealed at a high temperature of at least 400° C. in order to promote absorption of Si into the Al$_3$Ti film.

In this way, according to the fourth embodiment, the Al$_3$Ti film is deposited before Al deposition using an Al$_3$Ti target, and after depositing the antireflection film annealing is carried out at a high temperature of at least 400° C. in order to promote absorption of Si into the Al$_3$Ti film. As a result of this annealing, the Al$_3$Ti film coming into contact with the Al absorbs Si in the Al film, which reduces the amount of Si in the Al, and it is possible to suppress Si recrystallization growth in a step of cooling the wafer from the film formation temperature. In this way, it is possible to prevent formation of an enormous Si deposit, and by preventing pattern defects that would be caused by the Si deposit at the time of Al etching it is possible to prevent shorts between wires.

(Fifth Embodiment)

Figure 16:
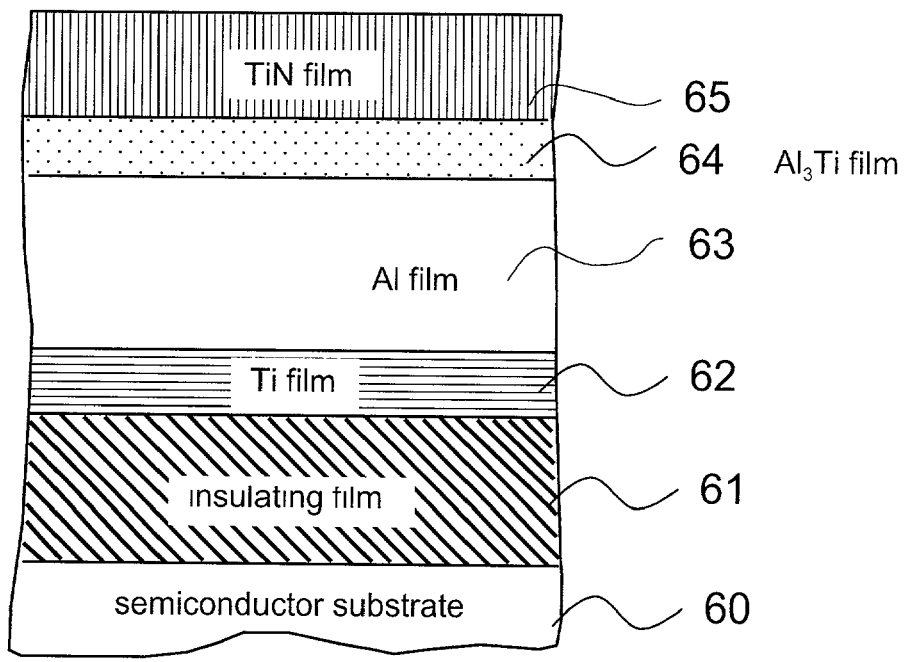
FIG. 16 is a first cross sectional drawing showing a process of a fifth embodiment of the present invention.
Figure 17:
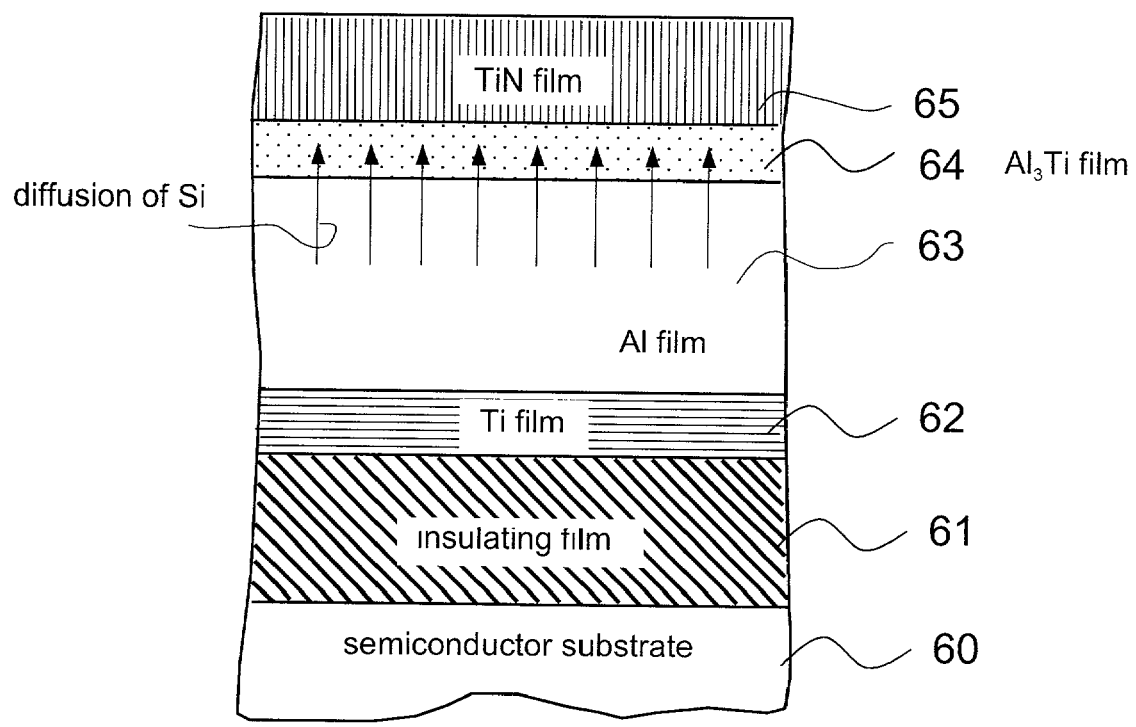
FIG. 17 is a second cross sectional drawing showing a process of the fifth embodiment of the present invention.

A fifth embodiment of the present invention will now be described using FIG. 16 and FIG. 17. First of all, an insulating film 61 (for example SiO2, BPSG) is deposited on a semiconductor substrate 60. Then, a Ti film 62 is deposited as a barrier layer. Next, an Al film 63 is deposited on the barrier layer 62 by a sputter method using an Al-0.8% Si-0.3% Cu target. The film formation conditions up to the Al film can be the same as in the related art. With this embodiment, after deposition of Al, an $Al_3Ti$ film 64 is previously deposited to a thickness of 10–20 nm by a sputter method using an $Al_3Ti$ target. After that a TiN anti-reflection film is deposited to a thickness of approximately 50 nm in the same way as in the related art. After deposition of the antireflection film has been completed, annealing is carried out at a high temperature of at least 400° C. in order to promote absorption of Si into the $Al_3Ti$ film.

As described above, according to the fifth embodiment, by depositing the $Al_3Ti$ film 64 by a sputter method using an $Al_3Ti$ target after Al film formation, and carrying out annealing at a high temperature of at least 400° C. in order to promote absorption of Si into the $Al_3Ti$ after deposition of the antireflection film, the $Al_3Ti$ film coming into contact with the Al is made to absorb Si in the Al film, which reduces the amount of Si in the Al, and it is possible to suppress Si recrystallization growth in a step of cooling the wafer from the film formation temperature. In this way, it is possible to prevent formation of an enormous Si deposit, and by preventing pattern defects that would be caused by the Si deposit at the time of Al etching it is possible to prevent shorts between wires.

(Sixth Embodiment)

Figure 18:
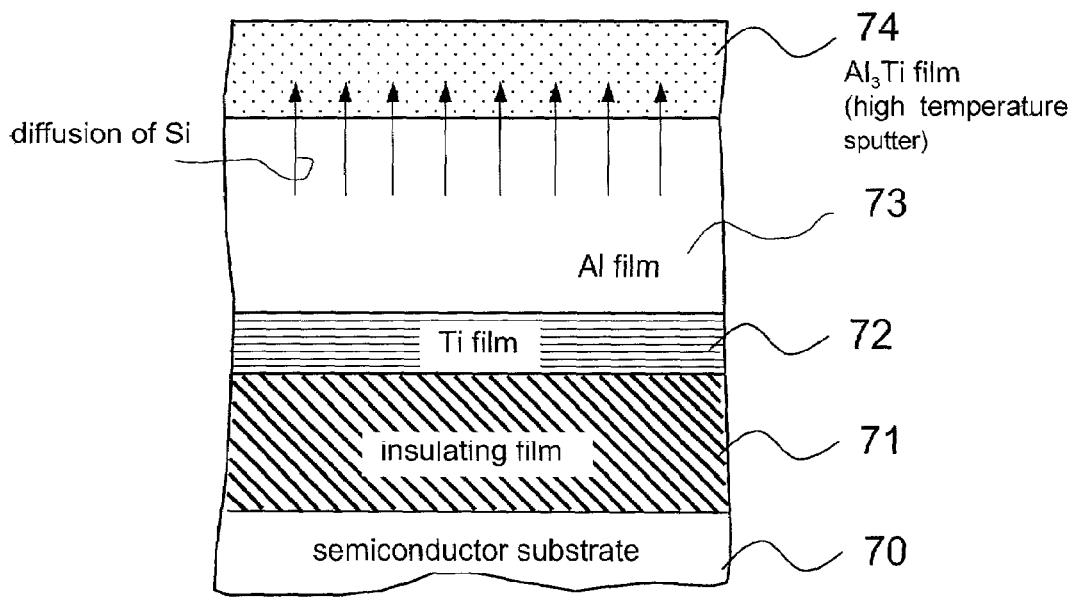
FIG. 18 is a first cross sectional drawing showing a process of a sixth embodiment of the present invention.
Figure 19:
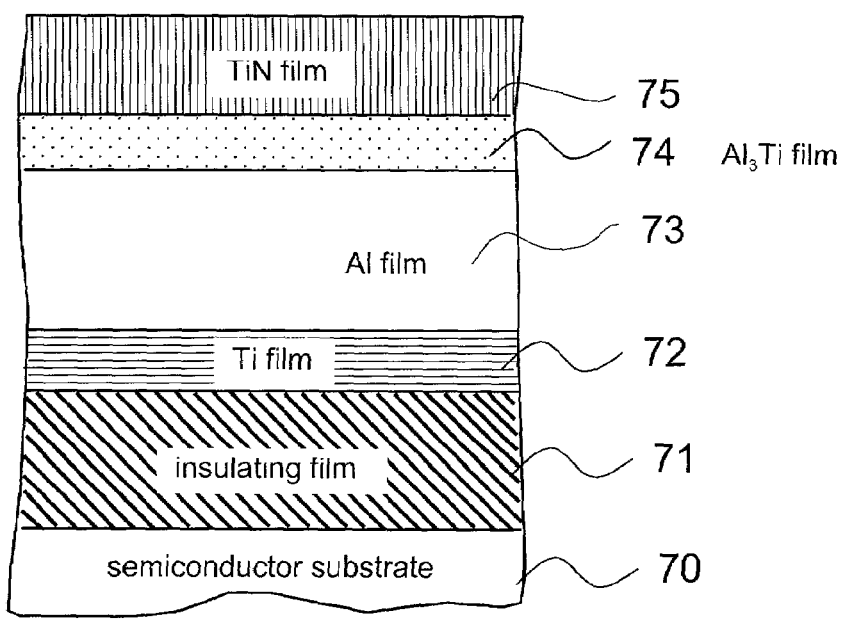
FIG. 19 is a second cross sectional drawing showing a process of the sixth embodiment of the present invention.

A sixth embodiment of the present invention will now be described using FIG. 18 and FIG. 19. First of all, an insulating film 71 (for example $SiO_2$, BPSG) is deposited on a semiconductor substrate 70. Next, a Ti film 72 is deposited to a thickness of 50 nm, as a barrier layer. An Al film 73 is deposited on the Ti film by a sputter method using an Al-0.8% Si-0.3% Cu target. The film formation conditions up to the Al film can be the same as in the related art. With this embodiment, after deposition of Al, an $Al_3Ti$ film 74 is deposited to a thickness of 10–20 nm by a sputter method using an $Al_3Ti$ target. Deposition at this time is performed at a high temperature of at least 400° C. After that a TiN anti-reflection film 75 is deposited to a thickness of about 50 nm in the same way as in the related art.

As described above, according to the sixth embodiment, the $Al_3Ti$ film 74 is deposited at a temperature of at least 400° C. by a sputter method using an $Al_3Ti$ target, after AL film formation. By carrying out the $Al_3Ti$ deposition at the high temperature of at least 400° C. in order to promote absorption of Si into the $Al_3Ti$, $Al_3Ti$ film coming into contact with the Al is made to absorb Si in the Al film, which reduces the amount of Si in the Al, and it is possible to suppress Si recrystallization growth in a step of cooling the wafer from the film formation temperature. In this way, it is possible to prevent formation of an enormous Si deposit, and by preventing pattern defects that would be caused by the Si deposit at the time of Al etching it is possible to prevent shorts between wires.

What is claimed is:

1. A method of depositing a wiring thin film over a semiconductor substrate, the method comprising:

providing a $Al_3Ti$ target;

providing a substrate;

forming a Ti layer over said substrate;

sputter depositing an $Al_3Ti$ layer on said Ti layer using said $Al_3Ti$ target;

depositing an Al layer onto said $Al_3Ti$ layer using an Al—Si—Cu target; and annealing said substrate at a temperature of at least 400° C. after said depositing an Al layer and without cooling said substrate, to promote absorption of Si from said Al layer into said $Al_3Ti$ layer.

2. A method as recited in claim 1, further comprising pattern-etching said Al layer thereby forming a wiring pattern.

3. A method as recited in claim 1, further comprising forming an insulating layer between said substrate and said Al3Ti layer.

4. A method of forming a wiring film, the method comprising:

providing a substrate;

depositing a Ti layer over said substrate; depositing an Al layer on said Ti layer using an Al—Si—Cu target; annealing the substrate at a temperature of at least 400° C. after said depositing an Al layer and without cooling the substrate, to form an $Al_3$ Ti layer on said Ti layer and to promote absorption of Si from said Al layer into said $Al_3Ti$ layer; and pattern etching said Al layer after said annealing.

5. A method of forming a wiring film, the method comprising:

providing a substrate;

depositing a Ti layer over the substrate;

depositing an $Al_3Ti$ layer on said Ti layer using an $Al_3Ti$ target;

depositing an Al layer on said $Al_3Ti$ layer using an $Al_3Ti$ target; annealing the substrate at a temperature of at least 400° C. after said depositing an Al layer and without cooling the substrate, to promote absorption of Si from said Al layer into said $Al_3Ti$ layer; and pattern etching said Al layer after said annealing.

6. A method as recited in claim 5, wherein said Al layer is deposited at a temperature of at least 400° C.

7. A method as recited in claim 5, wherein said $Al_3Ti$ layer is deposited at a temperature of at least 400° C.

8. A method as recited in claim 1, further comprising depositing a TiN film on said Al layer.

9. A method as recited in claim 4, further comprising forming an insulating layer between said substrate and said Ti film.

10. A method as recited in claim 4, further comprising depositing a TIN film on said Al layer.

11. A method as recited in claim 5, further comprising forming an insulating layer between said substrate and said $Al_3Ti$ layer.

12. A method as recited in claim 5, further comprising depositing a TiN film on said Al layer.

* * * * *